(12) United States Patent
Kamijo

(10) Patent No.: US 11,539,345 B2
(45) Date of Patent: Dec. 27, 2022

(54) SURFACE ACOUSTIC WAVE DEVICE AND METHOD FOR MANUFACTURING THE SAME

(71) Applicant: NDK SAW Devices Co., Ltd., Hokkaido (JP)

(72) Inventor: Atsushi Kamijo, Saitama (JP)

(73) Assignee: NDK SAW Devices Co., Ltd., Hokkaido (JP)

( * ) Notice: Subject to any disclaimer, the term of this patent is extended or adjusted under 35 U.S.C. 154(b) by 1225 days.

(21) Appl. No.: 16/013,946

(22) Filed: Jun. 21, 2018

(65) Prior Publication Data
US 2018/0375493 A1 Dec. 27, 2018

(30) Foreign Application Priority Data
Jun. 27, 2017 (JP) .............................. JP2017-124757

(51) Int. Cl.
| | |
|---|---|
| *H03H 9/145* | (2006.01) |
| *H03H 9/25* | (2006.01) |
| *H01L 41/047* | (2006.01) |
| *H03H 3/08* | (2006.01) |
| *H03H 9/02* | (2006.01) |

(Continued)

(52) U.S. Cl.
CPC ....... *H03H 9/14541* (2013.01); *C23C 14/185* (2013.01); *C23C 14/35* (2013.01); *C23C 14/542* (2013.01); *C30B 23/025* (2013.01); *C30B 29/02* (2013.01); *C30B 29/30* (2013.01); *H03H 3/08* (2013.01); *H03H 9/02559* (2013.01);
(Continued)

(58) Field of Classification Search
CPC ........... H03H 9/14541; H03H 9/02559; H03H 9/02535

USPC ...... 310/313 R, 313 A, 313 B, 313 C, 313 D
See application file for complete search history.

(56) References Cited

U.S. PATENT DOCUMENTS

| | | | |
|---|---|---|---|
| 6,316,860 B1 | 11/2001 | Kimura et al. | |
| 6,407,486 B1 | 6/2002 | Kimura et al. | |

(Continued)

FOREIGN PATENT DOCUMENTS

| | | |
|---|---|---|
| CN | 1578134 | 2/2005 |
| JP | 2002-305425 | 10/2002 |

(Continued)

OTHER PUBLICATIONS

Office Action of Taiwan Counterpart Application, with English translation thereof, dated Nov. 10, 2021, pp. 1-9.

*Primary Examiner* — Derek J Rosenau
(74) *Attorney, Agent, or Firm* — JCIPRNET

(57) ABSTRACT

A surface acoustic wave device includes a piezoelectric single crystal substrate and an electrode. The piezoelectric single crystal substrate is made of $LiTaO_3$ or $LiNbO_3$. The electrode includes a titanium film formed on the piezoelectric single crystal substrate and an aluminum film or a film containing aluminum as a main component. The aluminum film or the film is formed on the titanium film. The aluminum film or the film containing aluminum as the main component is a twin crystal film or a single crystal film, the aluminum film or the film has a (111) plane that is non-parallel to a surface of the piezoelectric single crystal substrate with an angle θ, and the aluminum film or the film has a [−1, 1, 0] direction parallel to an X-direction of a crystallographic axis of the piezoelectric single crystal substrate.

12 Claims, 8 Drawing Sheets

(51) Int. Cl.
   *C23C 14/18*  (2006.01)
   *C30B 29/02*  (2006.01)
   *C30B 23/02*  (2006.01)
   *C23C 14/35*  (2006.01)
   *C30B 29/30*  (2006.01)
   *C23C 14/54*  (2006.01)
   *H03H 9/64*   (2006.01)
   *H01L 41/29*  (2013.01)

(52) U.S. Cl.
   CPC ........... *H03H 9/25* (2013.01); *H01L 41/0477* (2013.01); *H01L 41/29* (2013.01); *H03H 9/6483* (2013.01)

(56) References Cited

U.S. PATENT DOCUMENTS

| | | | |
|---|---|---|---|
| 6,630,767 | B2 | 10/2003 | Inoue et al. |
| 7,605,524 | B2 | 10/2009 | Kamijo |
| 2005/0030125 | A1 | 2/2005 | Nakano et al. |
| 2007/0103038 | A1* | 5/2007 | Kamijo .............. H03H 9/02559 310/364 |
| 2007/0132037 | A1 | 6/2007 | Hoshi et al. |
| 2009/0243584 | A1 | 10/2009 | Zhang et al. |

FOREIGN PATENT DOCUMENTS

| | | |
|---|---|---|
| JP | 2007-134932 | 5/2007 |
| JP | 2011-109306 | 6/2011 |
| WO | 9916168 | 4/1999 |
| WO | 0074235 | 12/2000 |

\* cited by examiner

SURFACE ACOUSTIC WAVE DEVICE AND METHOD FOR MANUFACTURING THE SAME

CROSS-REFERENCE TO RELATED APPLICATIONS

This application is based on and claims priority under 35 U.S.C. § 119 to Japanese Patent Application No. 2017-124757, filed on Jun. 27, 2017, the entire content of which is incorporated herein by reference.

TECHNICAL FIELD

This disclosure relates to a surface acoustic wave device that includes a distinctive electrode and a method for manufacturing the surface acoustic wave device.

DESCRIPTION OF THE RELATED ART

For further development of information communication technology, a surface acoustic wave device is becoming more and more important. The surface acoustic wave device includes a piezoelectric single crystal substrate and an interdigital transducer (hereinafter also referred to as IDT in some cases) formed on this substrate. As the piezoelectric single crystal substrate, a quartz substrate, a lithium tantalate ($LiTaO_3$) substrate, a lithium niobate ($LiNbO_3$) substrate, and similar substrate are heavily used. For example, as a substrate for an RF band filter, a 64-degree rotated Y-cut $LiNbO_3$ substrate or a 32 to 44 degree rotated Y-cut $LiTaO_3$ substrate are used. The former provides a large electromechanical coupling coefficient, and the latter provides a large electromechanical coupling coefficient and a relatively small frequency temperature coefficient. The expression of 64 degree rotated Y-cut and similar expression means a cut that is cut out from a piezoelectric single crystal substrate such that an X-Z surface perpendicular to a Y-axis of the piezoelectric single crystal substrate is rotated by 64 degrees around an X-axis as a rotational center axis so as to be a principal surface. The same applies to the following similar expressions.

As a material of the IDT, aluminum or an aluminum alloy is used. Since they have good microfabrication properties and small specific gravities, their electrode-loading mass effects are small and electrical resistances are small, thus decreasing an insertion loss.

Incidentally, when the surface acoustic wave device is operated, repeated stress proportional to a working frequency is applied to the IDT. It has been known that this repeated stress causes what is called stressmigration to generate hirocks and voids on the IDT, thus deteriorating filter characteristics, specifically, power durability. This phenomenon occurs as the applied electric power is large, and as the working frequency is high. Therefore, a surface acoustic wave device used with a high electric power and a high frequency, for example, a duplexer for an RF band of 800 MHz to 2.4 GHz requires an electrode material having excellent power durability.

To meet the requirements, for example, WO99/16168 and WO00/74235, and Japanese Unexamined Patent Application Publication Nos. 2002-305425 and 2011-109306 disclose an electrode structure where a titanium film as an under layer film is formed on a $LiNbO_3$ or $LiTaO_3$ substrate, and on this titanium film, an aluminum film or a film containing aluminum as a main component is formed.

Specifically, WO99/16168 and WO00/74235 each disclose that both the titanium film and the aluminum film are single crystal films where only spots appear through selected-area electron diffraction. Japanese Unexamined Patent Application Publication Nos. 2002-305425 and 2011-109306 each disclose the electrode structure where the aluminum film or the film containing aluminum as the main component is formed on the titanium film, and the aluminum film or the film containing aluminum as the main component has six-fold symmetry spots that appear on an XRD pole figure. Furthermore, it has been disclosed that the aluminum film or the film containing aluminum as the main component has a twin structure. Japanese Unexamined Patent Application Publication No. 2011-109306 discloses that the aluminum film or the film containing aluminum as the main component has an average particle diameter equal to or less than 60 nm. According to the electrode structure disclosed in WO99/16168 and WO00/74235 and Japanese Unexamined Patent Application Publication Nos. 2002-305425 and 2011-109306 the power durability is improved compared with other electrode structures.

However, the electrode structures disclosed in WO99/16168 are configured such that the titanium film has a (001) plane having a normal direction in a vertical direction of a piezoelectric single crystal substrate and the aluminum film has a (110) plane having a normal direction in the vertical direction of the piezoelectric single crystal substrate (Claim 2 in WO99/16168).

The electrode structure disclosed in WO00/74235 is configured such that the aluminum film has a (112) plane having a normal direction oriented perpendicular to a piezoelectric single crystal substrate surface (Claim 2 in WO00/74235).

The electrode structure disclosed in Japanese Unexamined Patent Application Publication No. 2002-305425 is configured such that the aluminum film or the film containing aluminum as the main component is epitaxially grown in a [111]-axis direction along a Z-axis direction of a piezoelectric single crystal substrate. That is, in the case of Japanese Unexamined Patent Application Publication No. 2002-305425, the aluminum film or the film containing aluminum as the main component is a film having a (111) plane parallel to a (001) plane of the piezoelectric single crystal substrate.

The electrode structure disclosed in Japanese Unexamined Patent Application Publication No. 2011-109306 is configured to be a film where the six-fold symmetry spots appear and has the requirement on the particle diameter, while a positional relationship between a crystal surface of the aluminum film or the film containing aluminum as the main component and a crystal surface of the piezoelectric single crystal substrate is not clearly specified.

On the other hand, the inventors of this application have been also diligently conducting research for improving the power durability of the IDT by using the titanium film as the under layer film of the IDT. Then, the inventors have found that the improvement of the power durability of the IDT is possible from the aspect different from WO99/16168 and WO00/74235 and Japanese Unexamined Patent Application Publication Nos. 2002-305425 and 2011-109306.

A need thus exists for a surface acoustic wave device and a method for manufacturing the surface acoustic wave device which are not susceptible to the drawback mentioned above.

SUMMARY

According to an aspect of this disclosure, there is provided a surface acoustic wave device that includes a piezoelectric single crystal substrate and an electrode. The piezoelectric single crystal substrate is made of LiTaO$_3$ or LiNbO$_3$. The electrode includes a titanium film formed on the piezoelectric single crystal substrate and an aluminum film or a film containing aluminum as a main component. The aluminum film or the film is formed on the titanium film. The aluminum film or the film containing aluminum as the main component is a twin crystal film or a single crystal film, the aluminum film or the film has a (111) plane that is non-parallel to a surface of the piezoelectric single crystal substrate with an angle θ, and the aluminum film or the film has a [−1, 1, 0] direction parallel to an X-direction of a crystallographic axis of the piezoelectric single crystal substrate.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1A:
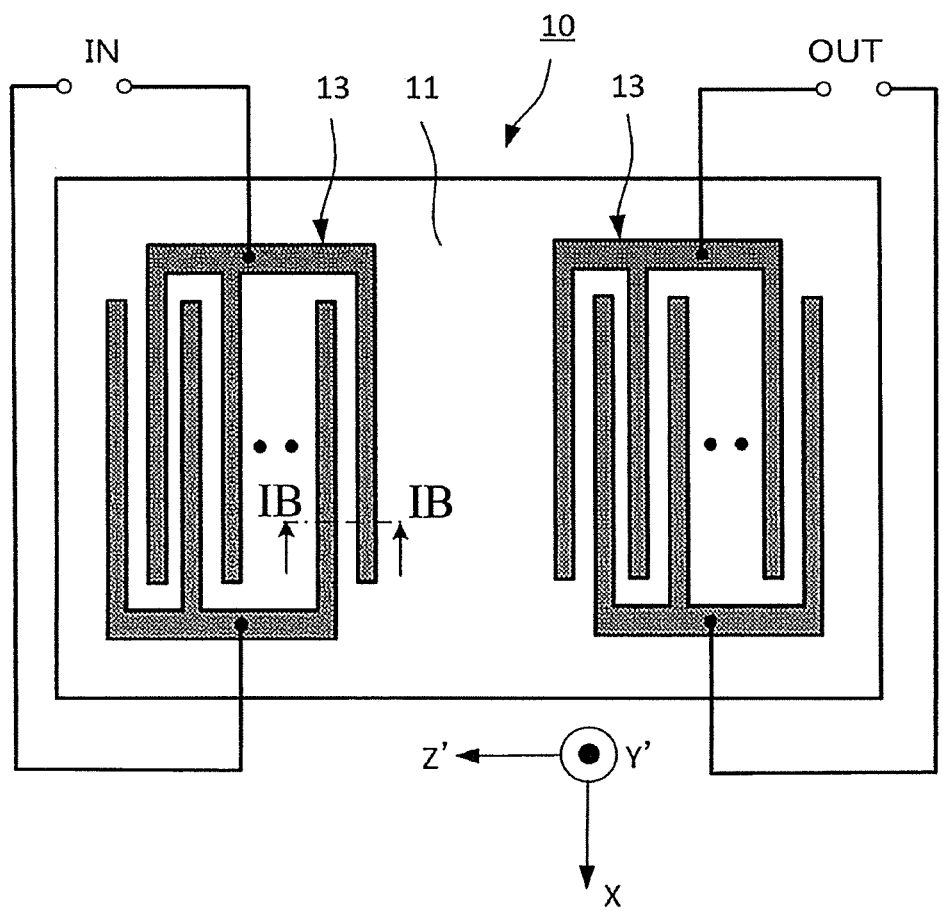
FIG. 1A and FIG. 1B are explanatory drawings of a surface acoustic wave device of the embodiment.

The following describes embodiments of the disclosure with reference to the drawings. Each drawing used in the descriptions is merely illustrated schematically for understanding the embodiments. In each drawing used in the descriptions, like reference numerals designate corresponding or identical elements, and therefore such elements will not be further elaborated in some cases. Shapes, dimensions, materials, and similar factor described in the following embodiments are merely preferable examples within the scope of the disclosure. Therefore, the disclosure is not limited to only the following embodiments.

1. EMBODIMENTS OF SURFACE ACOUSTIC WAVE DEVICE AND METHOD FOR MANUFACTURING SURFACE ACOUSTIC WAVE DEVICE

Figure 1B:
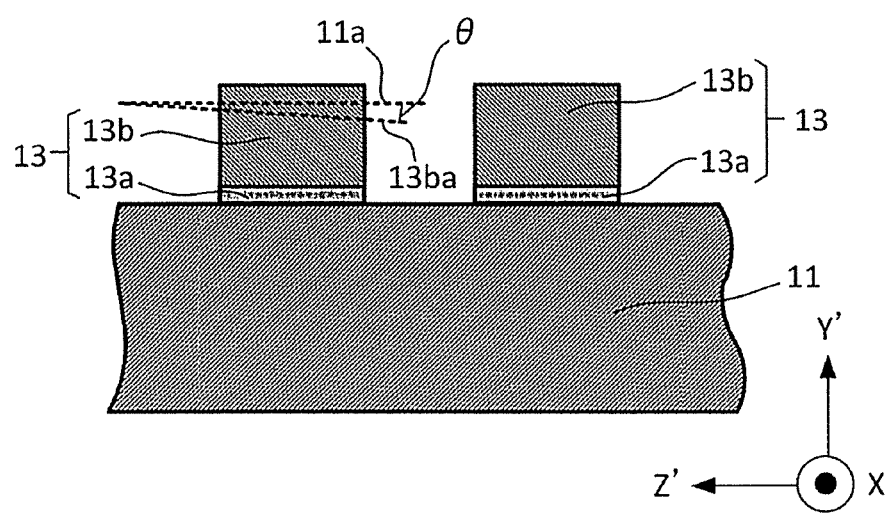

FIG. 1A and FIG. 1B are explanatory drawings of a surface acoustic wave device 10 of the embodiment. Especially, FIG. 1A is a plan view of the surface acoustic wave device 10, and FIG. 1B is a partial sectional drawing taken along the line IB-IB in FIG. 1A.

The surface acoustic wave device 10 includes a piezoelectric single crystal substrate 11 and an electrode (IDT) 13 that includes a titanium film 13a and an aluminum film or a film 13b containing aluminum as a main component that are disposed on this piezoelectric single crystal substrate 11 in sequence. The electrode 13 is configured to include an input side IDT and an output side IDT. Obviously, the structure of the surface acoustic wave device 10 is one example. For example, the surface acoustic wave device 10 may have a structure where the electrode 13 has a top surface and a side surface covered with an insulating film.

The piezoelectric single crystal substrate 11 is a LiTaO$_3$ substrate or a LiNbO$_3$ substrate, and preferably, a LiTaO$_3$ substrate or a LiNbO$_3$ substrate of 36 to 50 degree rotated Y-cut. However, when the surface acoustic wave device 10 is used as a surface acoustic wave device in an RF band, a LiTaO$_3$ substrate of 36 to 50 degree rotated Y-cut is more preferable.

Moreover, the piezoelectric single crystal substrate 11 to be prepared is a substrate polished to have a predetermined surface roughness. Specifically, the substrate is polished by a mechanical polishing method, and has a polished surface where what is called "polishing" is performed.

Furthermore, according to an experiment by the inventors of this application, the piezoelectric single crystal substrate 11 to be prepared is preferred to undergo only a cleaning process to remove organic matters and similar material on the substrate surface without undergoing a positive process such as an etching process on the surface. This is because a crystal surface of the piezoelectric single crystal substrate exposed by performing the positive process for, for example, removing a surface deteriorated layer, which is generated on the substrate surface when the piezoelectric single crystal substrate is polished, by etching includes not only a low-index plane indicated by a low index but also a high-index plane indicated by a higher order index. The aluminum film or the film containing aluminum as the main component grown on such crystal surface includes not only a single crystal film grown on the low-index plane but also a single crystal film grown on the high-index plane. Moreover, the high-index plane variously varies depending on not only the difference of a cut angle of the piezoelectric single crystal substrate to be used, but also the etching condition, typically the wet etching condition. Then, the high-index plane causes a problem in growing the predetermined aluminum film or film 13b containing aluminum as the main component with good reproducibility as an object of the embodiment.

Here, an unfavorable pretreatment means, for example, performing a treatment on the piezoelectric single crystal substrate 11 with at least one kind of etchants selected from phosphoric acid, pyrophosphoric acid, benzoic acid, octanoic acid, hydrochloric acid, nitric acid, sulfuric acid, hydrofluoric acid, buffered hydrofluoric acid, and potassium hydrogen sulfate. On the other hand, a preferred pretreatment means one or more treatments on the piezoelectric single crystal substrate 11 selected from a water cleaning treatment using pure water, a scrubbing treatment, an ashing treatment, a degreasing treatment with an organic solvent and similar treatment.

In this embodiment, only the above-described simple cleaning is required, thus providing an effect of a simplified manufacturing process.

The titanium film 13a having an excessively thick film thickness increases an electrical resistance of the electrode 13 itself, and the titanium film 13a having an excessively thin or excessively thick film thickness fails to obtain the desired aluminum film or film 13b containing aluminum as the main component according to this embodiment.

The titanium film 13a having an excessively low deposition rate decreases a throughput while an excessively high deposition rate decreases controllability of the film thickness, and the excessively low or excessively high deposition rate fails to obtain the desired aluminum film or film 13b containing aluminum as the main component according to this embodiment.

Moreover, according to the experiment by the inventors of this application, it has been proved that the film thickness and the deposition rate of the titanium film 13a are need to be optimized depending on the aluminum film or film 13b containing aluminum as the main component according to this embodiment is to be formed as a single crystal film or a twin crystal film. Therefore, the film thickness and the deposition rate of the titanium film 13a are preferred to be configured as follows, depending on whether the single crystal film or the twin crystal film is to be obtained as the aluminum film or film 13b containing aluminum as the main component. Note that, as a film deposition method of the titanium film 13a and the aluminum film 13b, any appropriate film deposition method such as a sputtering method, an ion beam deposition method, and similar method may be employed, and for example, a DC magnetron sputtering method may be employed.

Case of Obtaining Single Crystal Film

Preferably, the deposition rate of the titanium film 13a is configured to be 0.01 nm/second or more and 0.15 nm/second or less, and the film thickness of the titanium film 13a is configured to be 3 to 7.5 nm.

Preferably, the deposition rate of the titanium film 13a is configured to be 0.15 nm/second or more and 0.30 nm/second or less, and the film thickness of the titanium film 13a is configured to be 10 to 15 nm.

Preferably, the deposition rate of the titanium film 13a is configured to be 0.35 nm/second or more and 5 nm/second or less, and the film thickness of the titanium film 13a is configured to be 15 to 20 nm.

It is summarized that, when the single crystal film is to be obtained as the aluminum film or film 13b containing aluminum as the main component, preferably, the deposition rate of the titanium film 13a is configured to be 0.01 nm/second or more and 5 nm/second or less, and the film thickness of the titanium film 13a is configured to be 3 to 20 nm.

Case of Obtaining Twin Crystal Film

Preferably, the deposition rate of the titanium film 13a is configured to be 0.01 nm/second or more and 0.15 nm/second or less, and the film thickness of the titanium film 13a is configured to be 10 nm or more.

Preferably, the deposition rate of the titanium film 13a is configured to be 0.15 nm/second or more and 0.30 nm/second or less, and the film thickness of the titanium film 13a is configured to be 2.5 to 7.5 nm or 20 to 50 nm.

Preferably, the deposition rate of the titanium film 13a is configured to be 0.35 nm/second or more and 5 nm/second or less, and the film thickness of the titanium film 13a is configured to be 5 to 10 nm or 25 to 50 nm.

However, as described above, the titanium film 13a having the excessively thick film thickness is unfavorable because the electrical resistance of the electrode 13 increases. Then, even when the film thickness of the titanium film 13a is configured to be 20 nm or more in the above description, the film thickness is preferred to be 100 nm or less, and more preferred to be 50 nm or less.

The aluminum film or film 13b containing aluminum as the main component according to the embodiment is a twin crystal film or a single crystal film. Moreover, the film 13b has a (111) plane (a plane indicated by a dashed line 13ba in FIG. 1B) that is non-parallel to a surface, namely, a principal surface (a surface indicated by a dashed line 11a in FIG. 1B) of the piezoelectric single crystal substrate 11 and forming an angle θ (see FIG. 1B) with the principal surface in a range of a few degrees. Here, the angle θ is −1 to −2.5 degrees as described in Working Examples later.

The film 13b containing aluminum as the main component means a film made of any aluminum alloy that contains aluminum as the main component and small amounts of other elements. For example, the film 13b containing aluminum as the main component is made of an aluminum alloy where small amount of a metallic element such as copper (Cu) and/or magnesium (Mg) is added to aluminum.

2. WORKING EXAMPLES

Next, the embodiment will be further described in detail with some working examples.

2-1. Working Example 1

A 42 degree rotated Y-cut LiTaO$_3$ substrate that had a principal surface polished into a polished surface by the mechanical polishing method was prepared. After an ultrasonic cleaning was performed with pure water on this substrate, the substrate was introduced into a film deposition chamber of a DC magnetron sputtering apparatus. After evacuation of the film deposition chamber to $8\times10^{-8}$ Torr, a mass flow controller was passed to the film deposition chamber to introduce high purity Ar gas, a titanium film was deposited on the principal surface of the substrate, and further, an aluminum alloy film (hereinafter abbreviated as an Al-0.5Cu film) that contained copper (Cu) of 0.5 weight % to aluminum was deposited on this titanium film.

The deposition rate of the titanium film was fixed to 0.08 nm/second, and the film thickness of the titanium film was varied in a range of 0 to 20 nm, and then, deposition condition of the titanium film was variously varied. On the other hand, the deposition rate of the Al-0.5Cu film was fixed to 1.65 nm/second, and the film thickness of the Al-0.5Cu film was fixed to 132 nm. In the deposition of the titanium film, an argon flow rate was 50 sccm and a DC power was 140 W, and in the deposition of the Al-0.5Cu film, an argon flow rate was 10 sccm and a DC power was 1 kW. A substrate temperature was a room temperature.

For the Al-0.5Cu films of respective samples manufactured as described above, a four-axis X-ray diffraction apparatus having an X-ray source of CuKα was used to perform two pole figure measurements of (111) and (100). Diffraction angles (2θ) of a 111-reflection and 200-reflection were 38.5° and 44.8°, respectively. At this time, the samples were placed on an X-ray diffractometer (a goniometer stage) such that an X-axis of the 42-degree-rotated Y-cut LiTaO$_3$ substrate was matched with Phi (φ)=0°.

Figure 2:
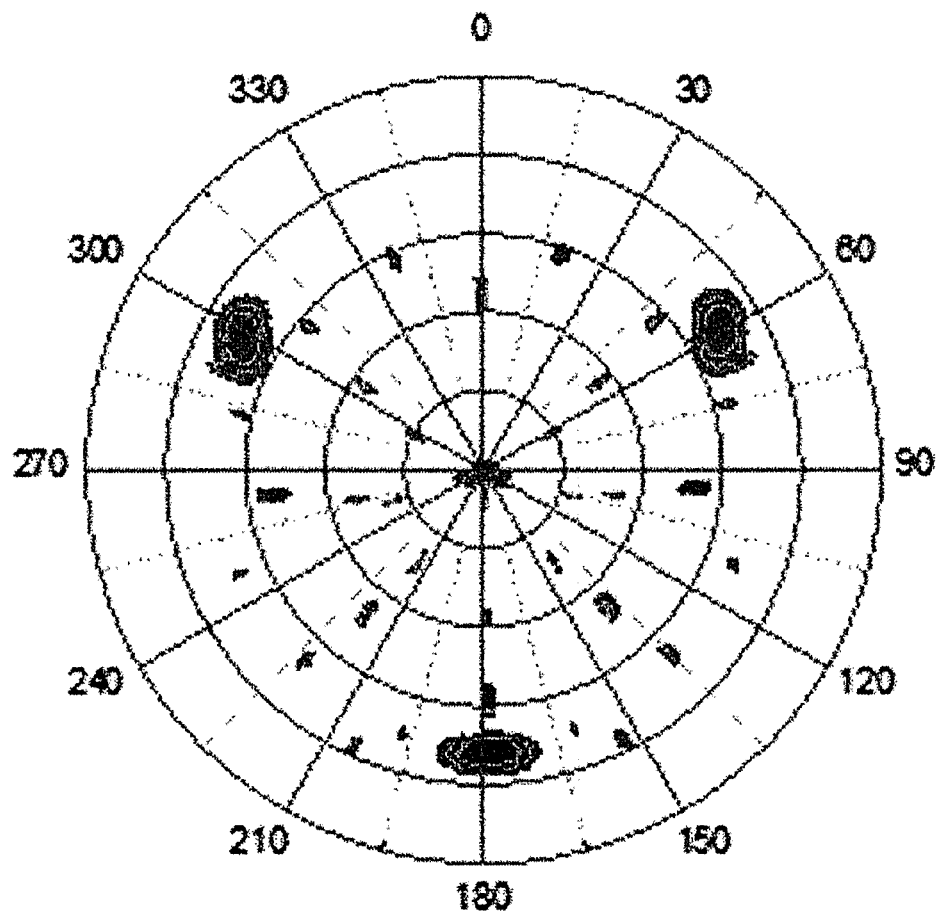
FIG. 2 is a drawing illustrating a (111) pole figure of a film formed in Working Example 1.
Figure 3:
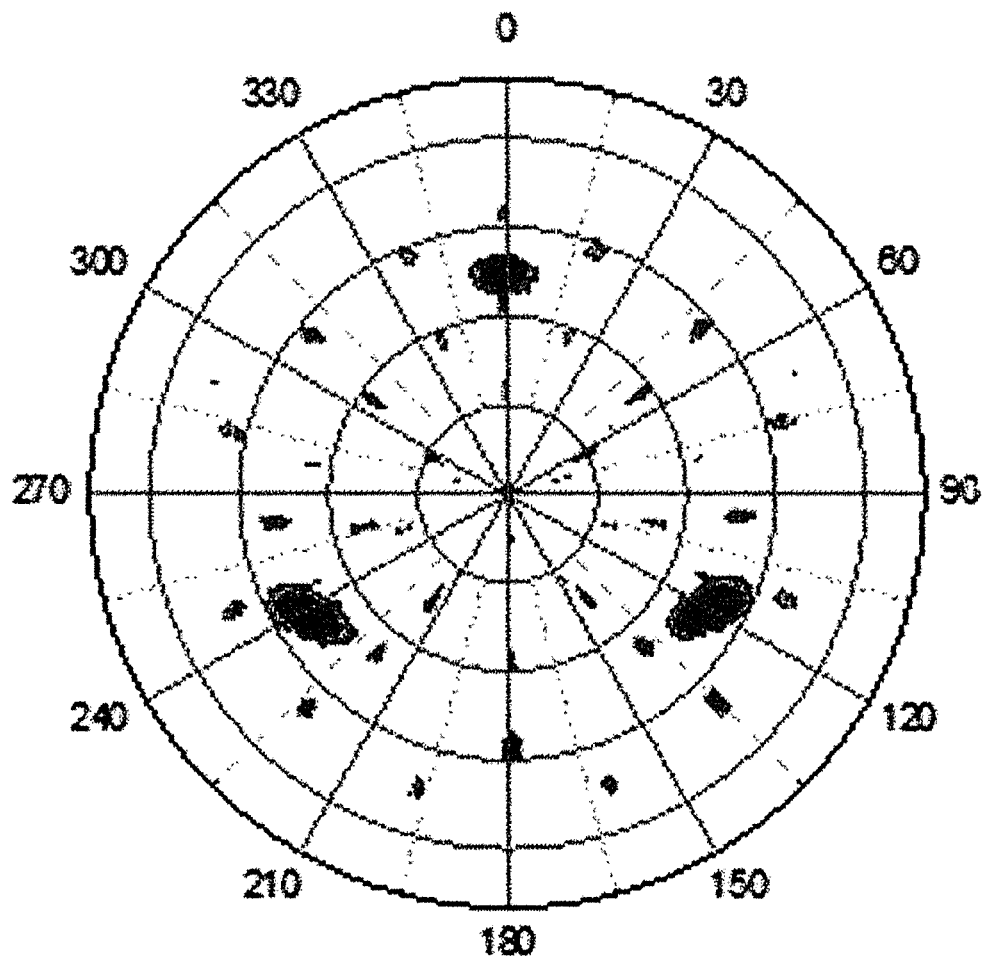
FIG. 3 is a drawing illustrating a (100) pole figure of the film formed in Working Example 1.

As measurement results, first, a (111) pole figure of the Al-0.5Cu film deposited on the titanium film having the film thickness of 4 nm is indicated in FIG. 2, and a (100) pole figure of this Al-0.5Cu film is indicated in FIG. 3. It is seen that, in the (111) pole figure in FIG. 2, a strong spot appeared on the center, and three spots appeared at positions of 60°, 180°, and 300° of Phi (φ) on a circumference of Psi (Ψ)=70°. It is seen that, in the (100) pole figure in FIG. 3, three spots appeared at positions of 0°, 120°, and 240° of Phi (φ) on a circumference of Psi (Ψ)=55°. These results indicate that the Al-0.5Cu film has a (111) single crystal growth, and the (111) plane is approximately parallel to the LiTaO$_3$ substrate surface, in detail, non-parallel having the angle θ (details will be described later with reference to FIG. 8), and the Al-0.5Cu film has epitaxially grown such that an X-axis direction of the LiTaO$_3$ substrate is parallel to a [−1, 1, 0] direction in the (111) plane of the Al-0.5Cu film. (Sharp spots other than the above-described spots in FIG. 2 and FIG. 3 are negligible because they are peaks derived from the LiTaO$_3$ substrate.) Even in the Al-0.5Cu film deposited on the titanium film having the film thickness of 3 nm or 5 nm, the pole figure indicating the (111) single crystal growth identical to FIG. 2 and FIG. 3 can be obtained.

Figure 4:
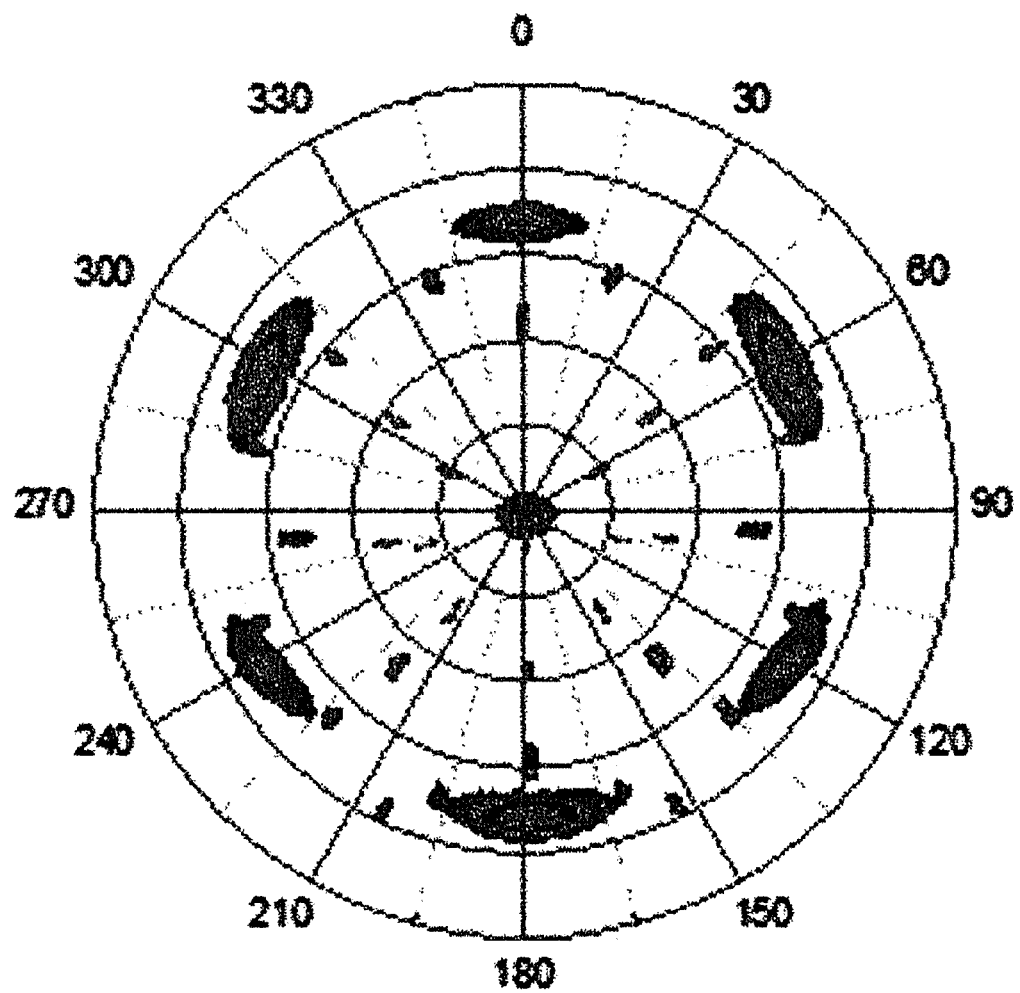
FIG. 4 is a drawing illustrating a (111) pole figure of another film formed in Working Example 1.
Figure 5:
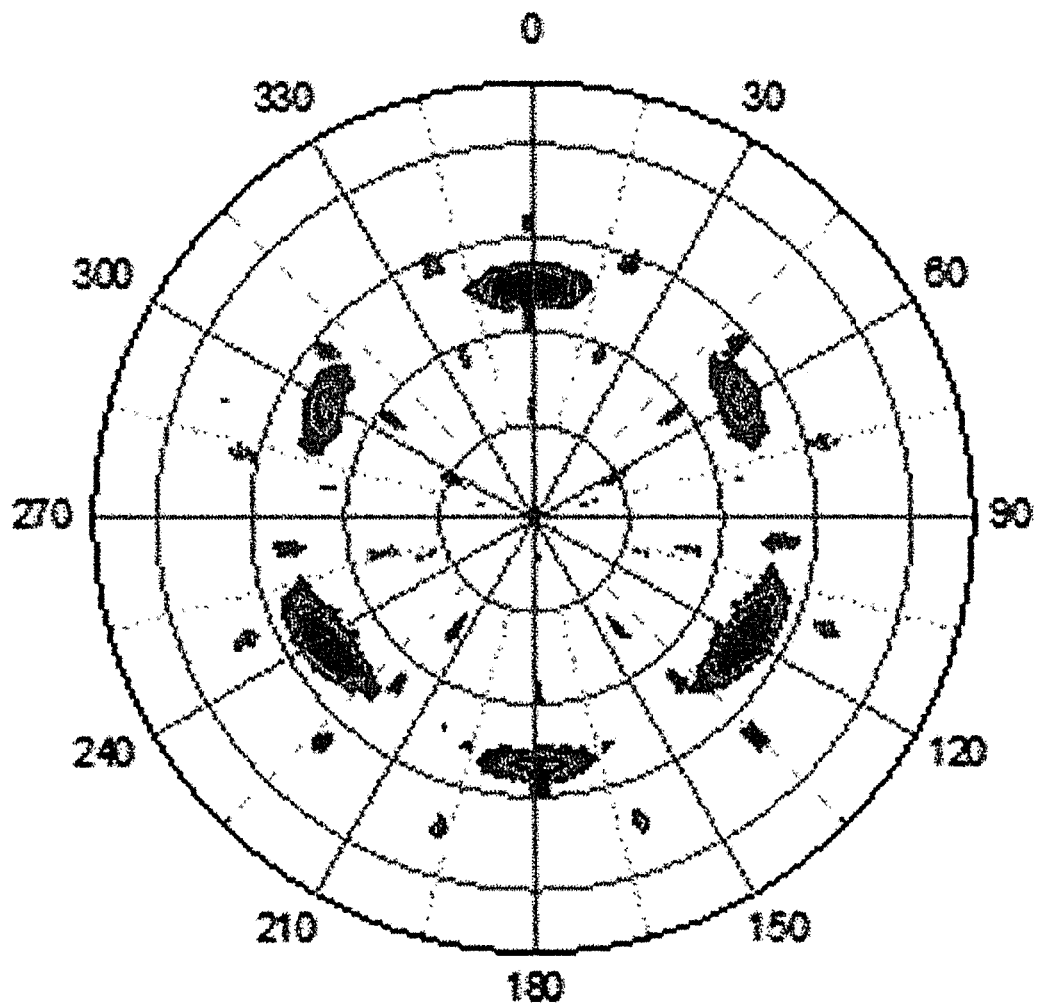
FIG. 5 is a drawing illustrating a (100) pole figure of the other film formed in Working Example 1.

Next, a (111) pole figure of the Al-0.5Cu film deposited on the titanium film having the film thickness of 10 nm is indicated in FIG. 4, and a (100) pole figure of this Al-0.5Cu film is indicated in FIG. 5. It is seen that, in the (111) pole figure in FIG. 4, a strong spot appears on the center, and six spots appeared at positions of 0°, 60°, 120°, 180°, 240°, and 300° of Phi (φ) on a circumference of Psi (Ψ)=70°. It is seen that, in the (100) pole figure in FIG. 5, six spots appeared at positions of 0°, 60°, 120°, 180°, 240°, and 300° of Phi (φ) on a circumference of Psi (Ψ)=55°. These results indicate that the Al-0.5Cu film has a (111) twin crystal growth and the (111) plane is non-parallel to the LiTaO$_3$ substrate surface having the angle θ (details will be described later with reference to FIG. 8), and the Al-0.5Cu film has epitaxially grown such that an X-axis direction of the LiTaO$_3$ substrate is parallel to a [−1, 1, 0] direction in the (111) twin crystal plane of the Al-0.5Cu film. Even in the Al-0.5Cu film deposited on the titanium film having the film thickness of 15 nm or 20 nm, the pole figure indicating the (111) twin crystal growth identical to FIG. 4 and FIG. 5 can be obtained.

Figure 6:
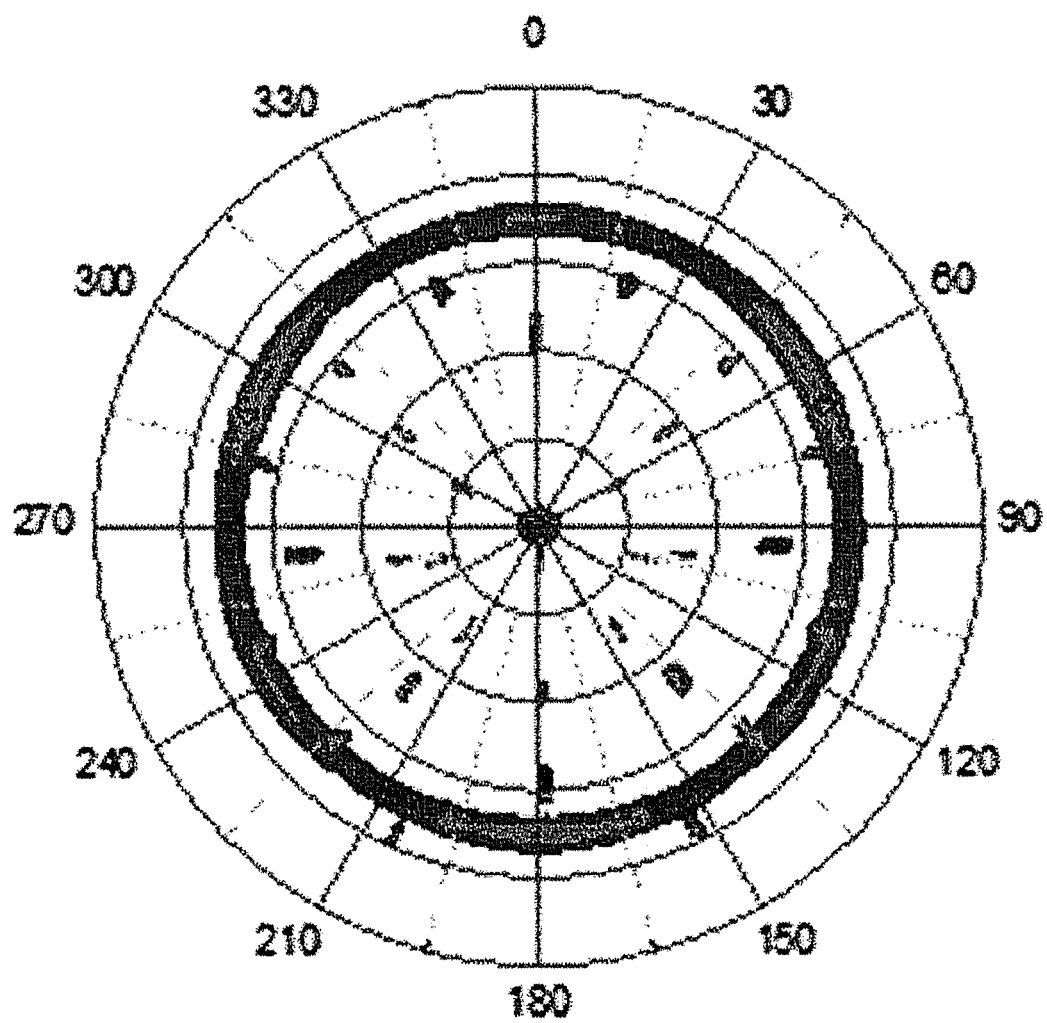
FIG. 6 is a drawing illustrating a (111) pole figure of yet another film formed in Working Example 1.
Figure 7:
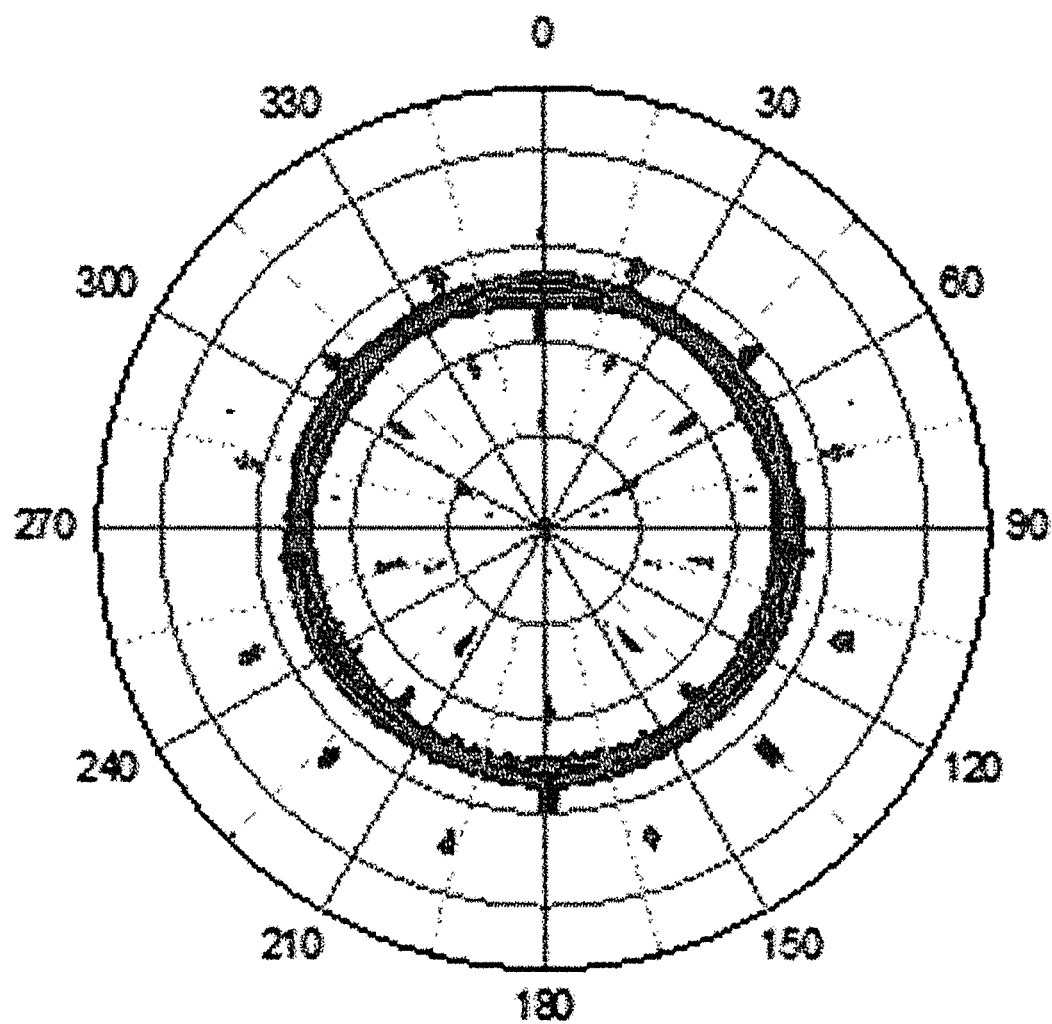
FIG. 7 is a drawing illustrating a (100) pole figure of the yet other film formed in Working Example 1.

Next, a (111) pole figure of the Al-0.5Cu film deposited on the titanium film having the film thickness of 2 nm is indicated in FIG. 6, and a (100) pole figure of this Al-0.5Cu film is indicated in FIG. 7. It is seen that, in the (111) pole figure in FIG. 6, a strong spot appeared on the center, and a ring appeared on a circumference of Psi (Ψ)=70°. It is seen that, in the (100) pole figure in FIG. 7, a ring appeared on a circumference of Psi (Ψ)=55°. These results indicate that the (111) plane of the Al-0.5Cu film has what is called a preferred orientation growth because the (111) plane is parallel to the LiTaO$_3$ substrate surface while having random in-plane directions. Even in the Al-0.5Cu film deposited on the titanium film having the film thickness of 1.5 nm or 2.8 nm, the pole figure indicating the (111) preferred orientation growth identical to FIG. 6 and FIG. 7 can be obtained.

A sample where the Al-0.5Cu film was deposited on the piezoelectric single crystal substrate without titanium film and a sample where the Al-0.5Cu film was deposited on the titanium film having the film thickness of 1 nm were additionally prepared to obtain the pole figures similar to the above description. However, the intensities of the (111) peak of the Al-0.5Cu films were low and clear ring patterns were not recognized.

According to the above-described results, when the titanium film is not deposited or when the titanium film has an excessively thin film thickness (the film thickness is 3 nm or less), the desired aluminum film according to this embodiment cannot be obtained. It is seen that, depending on the film thickness and the film forming condition of the titanium film, the aluminum film becomes a simple preferred orientation film, a twin crystal aluminum film according to this embodiment, or a single crystal aluminum film according to this embodiment.

Photolithography technology and dry etching technology were used to process the above-described electrode films, and a ladder-type surface acoustic wave filter designed for 2 GHz band was manufactured. A power durability evaluation test was performed on the manufactured surface acoustic wave filter. Conditions of the evaluation test were based on an evaluation system and test conditions described in WO99/16168 or WO00/74235, an input power was 0.8 W, a test temperature was 85° C., and a period where a center frequency varied by 0.1 MHz was defined as a power durability life. Table 1 indicates the result of this power durability life test.

TABLE 1

| Ti UNDERLAYER FILM THICKNESS (nm) | ORIENTATION STRUCTURE OF Al—0.5Cu FILM | POWER DURABILITY LIFE (h) |
| --- | --- | --- |
| 2 | (111) PREFERRED ORIENTATION | 4 |
| 4 | (111) SINGLE CRYSTAL | 55 |
| 5 | (111) SINGLE CRYSTAL | 60 |
| 10 | (111) TWINS | 28 |
| 15 | (111) TWINS | 33 |

Table 1 indicates that the electrode having the (111) twin crystal growth has the power durability life equal to or more than five times of the power durability life of the electrode having the (111) preferred orientation growth, and the electrode having the (111) single crystal growth similarly has the power durability life equal to or more than 10 times. Then, it is seen that the electrode film of this embodiment has the significantly improved power durability.

2-2. Working Example 2

As Working Example 2, an example where a 36 degree rotated Y-cut LiTaO$_3$ substrate is used as the piezoelectric single crystal substrate will be described. The 36 degree rotated Y-cut LiTaO$_3$ substrate that had a principal surface polished into a polished surface by the mechanical polishing method was prepared. Similarly to Working Example 1, after the ultrasonic cleaning was performed with pure water on this substrate, the substrate was introduced into the DC magnetron sputtering apparatus, and the titanium film and the Al-0.5Cu film were deposited in sequence. However, the deposition rate of the titanium film was fixed to 0.23 nm/second, and the film thickness of the titanium film was varied in a range of 2 to 50 nm. The film thickness of the Al-0.5Cu film was similar to Working Example 1. The deposition condition of the titanium film was configured such that the argon flow rate was 50 sccm and the DC power was 300 W, thus obtaining the above-described deposition rate. The substrate temperature was the room temperature, similarly to Working Example 1.

Similarly to Working Example 1, the pole figure measurements were performed on the manufactured samples. According to (111) and (100) pole figures, it was found that the Al-0.5Cu film had the (111) preferred orientation growth in the case of the titanium film having the film thickness of 2 nm, the Al-0.5Cu film had the (111) twin crystal growth in the case of the titanium film having the film thickness of 2.5 nm to 7.5 nm, the Al-0.5Cu film had the (111) single crystal growth in the case of the titanium film having the film thickness of 10 nm to 15 nm, and the Al-0.5Cu film had the twin crystal growth in the case of the titanium film having the film thickness of 20 nm to 50 nm.

The manufactured samples were processed similarly to Working Example 1 to manufacture the ladder-type surface acoustic wave filter similarly to Working Example 1, and the power durability evaluation test was performed. Table 2 indicates the result.

TABLE 2

| Ti UNDERLAYER FILM THICKNESS (nm) | ORIENTATION STRUCTURE OF Al—0.5Cu FILM | POWER DURABILITY LIFE (h) |
| --- | --- | --- |
| 2 | (111) PREFERRED ORIENTATION | 4.2 |
| 3 | (111) TWINS | 24 |
| 7.5 | (111) TWINS | 27 |
| 10 | (111) SINGLE CRYSTAL | 54 |
| 15 | (111) SINGLE CRYSTAL | 66 |
| 20 | (111) TWINS | 28 |
| 50 | (111) TWINS | 31 |

Table 2 indicates that the electrode having the (111) twin crystal growth has the power durability life equal to or more than five times of the power durability life of the electrode having the (111) preferred orientation growth, and the electrode having the (111) single crystal growth similarly has the power durability life equal to or more than 10 times. Then, it is seen that the electrode film of this embodiment has the significantly improved power durability. It is also seen that even in the case where the cut angle of the piezoelectric single crystal substrate is 36 degrees, the effect similar to the case where the cut angle is 42 degrees (the case of Working Example 1) is obtained.

2-3. Working Example 3

As Working Example 3, an example where a 50 degree rotated Y-cut LiTaO$_3$ substrate is used as the piezoelectric single crystal substrate will be described. The 50 degree rotated Y-cut LiTaO$_3$ substrate that had a principal surface finished into a polished surface by the mechanical polishing method was prepared. Similarly to Working Example 1, after the ultrasonic cleaning was performed with pure water on this substrate, the substrate was introduced into the DC magnetron sputtering apparatus, and the titanium film and the Al-0.5Cu film were laminated in sequence. However, the deposition rate of the titanium film was fixed to 0.50 nm/second, and the film thickness of the titanium film was varied in a range of 5 to 50 nm. The film thickness of the Al-0.5Cu film was similar to Working Example 1. The deposition condition of the titanium film was configured such that the argon flow rate was 50 sccm and the DC power was 500 W, thus obtaining the above-described deposition rate. The substrate temperature was the room temperature, similarly to Working Example 1.

Similarly to Working Example 1, the pole figure measurements were performed on the manufactured samples. According to (111) and (100) pole figures, it was found that the Al-0.5Cu film had the (111) twin crystal growth in the case of the titanium film having the film thickness of 5 to 10 nm, the Al-0.5Cu film had the (111) single crystal growth in the case of the titanium film having the film thickness of 15 nm to 20 nm, and the Al-0.5Cu film had the twin crystal growth in the case of the titanium film having the film thickness of 25 nm to 50 nm.

The manufactured samples were processed similarly to Working Example 1 to manufacture the ladder-type surface acoustic wave filter similarly to Working Example 1, and the power durability evaluation test was performed. Table 3 indicates the result.

TABLE 3

| Ti UNDERLAYER FILM THICKNESS (nm) | ORIENTATION STRUCTURE OF Al—0.5Cu FILM | POWER DURABILITY LIFE (h) |
| --- | --- | --- |
| 5 | (111) TWINS | 26 |
| 10 | (111) TWINS | 28 |
| 15 | (111) SINGLE CRYSTAL | 59 |
| 20 | (111) SINGLE CRYSTAL | 65 |
| 25 | (111) TWINS | 30 |
| 50 | (111) TWINS | 35 |

According to the result indicated in Table 3 and the results of the power durability evaluation test (4 h and 4.2 h) of the electrodes having the (111) preferred orientation growth indicated in Table 1 and Table 2, the electrode having the (111) twin crystal growth has the power durability life equal to or more than five times of the power durability life of the electrode having the (111) preferred orientation growth, and the electrode having the (111) single crystal growth similarly has the power durability life equal to or more than 10 times. Then, it is seen that the electrode film of this embodiment has the significantly improved power durability. It is also seen that even in the case where the cut angle of the piezoelectric single crystal substrate is 50 degrees, the effect similar to the cases where the cut angles are 42 degrees and 36 degrees (the cases of Working Example 1 and Working Example 2) is obtained.

3. ANGLE θ

Figure 8:
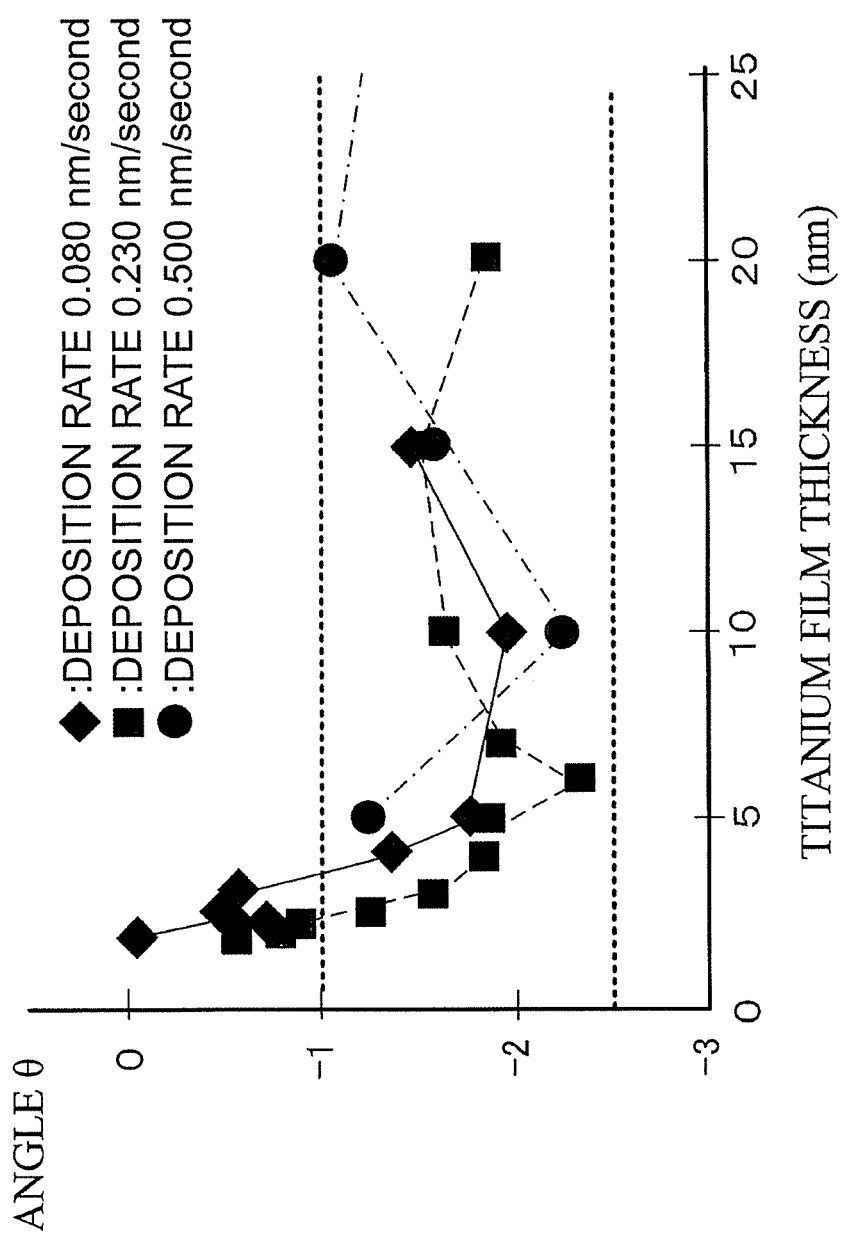
FIG. 8 is a drawing describing a relation between a crystal surface of an aluminum film or a film containing aluminum as a main component and a piezoelectric single crystal substrate surface (principal surface) according to the embodiment.

Next, a description will be given of the angle θ (see FIG. 1B) between the surface, that is, the principal surface of the piezoelectric single crystal substrate and the (111) plane of the aluminum film according to this embodiment. As apparent from the above-described Working Examples, in the case of the surface acoustic wave device of this embodiment, the power durability improves when the aluminum film 13b is the twin crystal film or the single crystal film. Then, according to the result of the detailed examination on the states of the films by the inventors, it was found that the above-described twin crystal film or single crystal film was formed when the above-described angle θ was in a predetermined range. The result is indicated in FIG. 8 where a horizontal axis indicates the titanium film thickness (nm) and a vertical axis indicates the above-described angle θ, and relations between the film thickness of the titanium film 13a and the angle θ of the Al-0.5Cu film 13b are plotted for respective samples in the above-described Working Examples.

It was found that, on each plotted sample, when the Al-0.5Cu film 13b has the twin structure or the single crystal structure, the angle θ exists in a range of −1 degree to −2.5 degrees in the titanium film thickness of 3 to 50 nm (in FIG. 8, to 25 nm) not so much depending on the film thickness. Therefore, the aluminum film or the film containing aluminum as the main component having the higher power durability according to this embodiment is specified to have the above-described angle θ of −1 to −2.5 degrees.

The above-described angle θ of each sample is measured as a shift amount of a peak position of 111 reflection from Psi (ψ)=0° when the Psi (ψ) axis is scanned in a range of ±10° having Phi (φ)=0° at an arrangement of the (111) pole figure measurement.

4. OTHER EMBODIMENTS

Even in the case of the following modifications of this disclosure, the effects similar to the above-described embodiments can be obtained. For example, a configuration to promote a synthesis of the film may be added using an aluminum film where small amount of silicon, titanium, palladium, and similar material is added as the aluminum film. As the aluminum film, an aluminum film where one or more kinds of metals selected from titanium, palladium, niobium, nickel, magnesium, germanium, silicon, cobalt, zinc, lithium, tantalum, gold, silver, platinum, chromium, hafnium, cadmium, tungsten, and vanadium are added may be used to form this aluminum film so as to have an average crystal grain diameter in 1/50 to 1/5 of an electrode finger width of the IDT, thus adding a configuration to facilitate synthesis of the film. Furthermore, any appropriate techniques are applicable without departing from the spirit and scope of the disclosure.

In the embodiments of the surface acoustic wave device, the angle θ is preferred to be in a range of −1 to −2.5 degrees.

In the embodiments of the surface acoustic wave device, the titanium film is preferred to have a film thickness of 3 to 20 nm, and the aluminum film or the film containing aluminum as the main component is preferred to be a single crystal film.

In the embodiments of the surface acoustic wave device, the titanium film is preferred to have a film thickness of 3 to 50 nm, and the aluminum film or the film containing aluminum as the main component is preferred to be a twin crystal film.

In the embodiments of the surface acoustic wave device, the piezoelectric single crystal substrate is preferred to be a LiTaO$_3$ or LiNbO$_3$ piezoelectric single crystal substrate of 36 to 50 degree rotated Y-cut.

With the method for manufacturing the surface acoustic wave device according to the embodiment, the method for manufacturing the surface acoustic wave device includes forming a titanium film on a LiTaO$_3$ or LiNbO$_3$ piezoelectric single crystal substrate of 36 to 50 degree rotated Y-cut, and forming an aluminum film or a film containing aluminum as a main component on the titanium film. The aluminum film or the film containing aluminum as the main component is a twin crystal film or a single crystal film. The aluminum film or the film containing aluminum as the main component has a (111) plane non-parallel to a surface of the piezoelectric single crystal substrate with an angle θ. Moreover, the aluminum film or the film containing aluminum as the main component has a [−1, 1, 0] direction parallel to an X-direction of a crystallographic axis of the piezoelectric single crystal substrate. The titanium film is formed such that the titanium film has a deposition rate and a film thickness configured to form the aluminum film or the film containing aluminum as the main component.

In the embodiments of the method for manufacturing the surface acoustic wave device, the titanium film is preferred to be formed such that the titanium film has the film thickness configured to be in a predetermined film thickness range, and the titanium film has the deposition rate configured to be in a preliminarily obtained predetermined rate range corresponding to the predetermined film thickness range.

In the embodiments of the method for manufacturing the surface acoustic wave device, the piezoelectric single crystal substrate to be used is preferred to be a piezoelectric single crystal substrate on which a predetermined mechanical polishing is performed and a chemical etching process is not performed.

With the surface acoustic wave device according to the embodiments, a device having higher power durability compared with a conventional device can be obtained. With the method for manufacturing the surface acoustic wave device according to the embodiments, a device having higher power durability compared with a conventional device can be easily manufactured.

The principles, preferred embodiment and mode of operation of the disclosure have been described in the foregoing specification. However, the disclosure which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the disclosure. Accordingly, it is expressly intended that all such variations, changes and equivalents which fall within the spirit and scope of the disclosure as defined in the claims, be embraced thereby.

What is claimed is:

1. A surface acoustic wave device comprising:
    a piezoelectric single crystal substrate made of LiTaO$_3$ or LiNbO$_3$; and
    an electrode that includes a titanium film deposited on the piezoelectric single crystal substrate and an aluminum film or a film containing aluminum as a main component, the aluminum film or the film being deposited on the titanium film, wherein
    the aluminum film or the film containing aluminum as the main component is a twin crystal film or a single crystal film, the aluminum film or the film has a (111) plane that is non-parallel to a surface of the piezoelectric single crystal substrate with an angle θ, and the aluminum film or the film has a [−1, 1, 0] direction parallel to an X-direction of a crystallographic axis of the piezoelectric single crystal substrate,
    wherein the angle θ is in a range of −1 degrees to −2.5 degrees.

2. The surface acoustic wave device according to claim 1, wherein
    the piezoelectric single crystal substrate is a LiTaO$_3$ or LiNbO$_3$ piezoelectric single crystal substrate of 36 to 50 degree rotated Y-cut.

3. The surface acoustic wave device according to claim 1, wherein
    in a case when the aluminum film or the film containing aluminum as the main component is twin crystal film, the titanium film has a film thickness of 3 to 50 nm, and
    in a case when the aluminum film or the film containing aluminum as the main component is single crystal film, the titanium film has a film thickness of 3 to 20 run.

4. A method for manufacturing a surface acoustic wave device, comprising:
    forming a titanium film on a LiTaO$_3$ or LiNbO$_3$ piezoelectric single crystal substrate of 36 to 50 degree rotated Y-cut; and
    forming an aluminum film or a film containing aluminum as a main component on the titanium film, the aluminum film or the film being a twin crystal film or a single crystal film, the aluminum film or the film having a (111) plane that is non-parallel to a surface of the piezoelectric single crystal substrate with an angle θ, and the aluminum film or the film having a [−1, 1, 0] direction parallel to an X-direction of a crystallographic axis of the piezoelectric single crystal substrate, wherein
    the titanium film is formed such that the titanium film has a deposition rate and a film thickness configured to form the aluminum film or the film containing aluminum as the main component, and wherein the angle θ is in a range of −1 degrees to −2.5 degrees.

5. The method for manufacturing the surface acoustic wave device according to claim 4, wherein
the titanium film is formed such that the titanium film has the film thickness configured to be in a predetermined film thickness range, and the titanium film has the deposition rate configured to be in a predetermined rate range preliminarily obtained corresponding to the predetermined film thickness range.

6. The method for manufacturing the surface acoustic wave device according to claim 4, wherein
the piezoelectric single crystal substrate has a polished surface on which a mechanical polishing is performed, and a chemical etching process is not performed on the piezoelectric single crystal substrate.

7. The method for manufacturing the surface acoustic wave device according to claim 4, wherein
in a case when the aluminum film or the film containing aluminum as the main component is formed on the titanium film as single crystal, the titanium film is formed such that the titanium film has the deposition rate configured to be 0.01 nm/second or more and 0.15 nm/second or less, and the titanium film has the film thickness configured to be 3 to 7.5 nm.

8. The method for manufacturing the surface acoustic wave device according to claim 4, wherein
in a case when the aluminum film or the film containing aluminum as the main component is formed on the titanium film as single crystal, the titanium film is formed such that the titanium film has the deposition rate configured to be 0.15 nm/second or more and 0.30 nm/second or less, and the titanium film has the film thickness configured to be 10 to 15 nm.

9. The method for manufacturing the surface acoustic wave device according to claim 4, wherein
in a case when the aluminum film or the film containing aluminum as the main component is formed on the titanium film as single crystal, the titanium film is formed such that the titanium film has the deposition rate configured to be 0.35 nm/second or more and 0.50 nm/second or less, and the titanium film has the film thickness configured to be 15 to 20 nm.

10. The method for manufacturing the surface acoustic wave device according to claim 4, wherein
in a case when the aluminum film or the film containing aluminum as the main component is formed on the titanium film as twin crystal, the titanium film is formed such that the titanium film has the deposition rate configured to be 0.01 nm/second or more and 0.15 nm/second or less, and the titanium film has the film thickness configured to be 10 to 50 nm.

11. The method for manufacturing the surface acoustic wave device according to claim 4, wherein
in a case when the aluminum film or the film containing aluminum as the main component is formed on the titanium film as twin crystal, the titanium film is formed such that the titanium film has the deposition rate configured to be 0.15 nm/second or more and 0.30 nm/second or less, and the titanium film has the film thickness configured to be 2.5 to 10 nm or 25 to 50 nm.

12. The method for manufacturing the surface acoustic wave device according to claim 4, wherein
in a case when the aluminum film or the film containing aluminum as the main component is formed on the titanium film as twin crystal, the titanium film is formed such that the titanium film has the deposition rate configured to be 0.35 nm/second or more and 0.50 nm/second or less, and the titanium film has the film thickness configured to be 5 to 7.5 nm or 20 to 50 nm.

* * * * *